(12) United States Patent
Hegedus

(10) Patent No.: US 9,647,148 B2
(45) Date of Patent: May 9, 2017

(54) DEVICE FOR INDIVIDUAL FINGER ISOLATION IN AN OPTOELECTRONIC DEVICE

(71) Applicant: ALTA DEVICES, Inc., Santa Clara, CA (US)

(72) Inventor: Andreas Hegedus, Burlingame, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 0 days.

(21) Appl. No.: 14/480,147

(22) Filed: Sep. 8, 2014

(65) Prior Publication Data

US 2015/0013762 A1     Jan. 15, 2015

Related U.S. Application Data

(62) Division of application No. 13/222,310, filed on Aug. 31, 2011, now Pat. No. 8,846,417.

(51) Int. Cl.
| | |
|---|---|
| *H01L 21/02* | (2006.01) |
| *H01L 31/0224* | (2006.01) |
| *H01L 31/02* | (2006.01) |
| *H01L 31/18* | (2006.01) |
| *H01L 21/66* | (2006.01) |

(52) U.S. Cl.
CPC ...... *H01L 31/022433* (2013.01); *H01L 22/22* (2013.01); *H01L 31/0201* (2013.01); *H01L 31/02013* (2013.01); *H01L 31/02021* (2013.01); *H01L 31/188* (2013.01); *Y02E 10/50* (2013.01)

(58) Field of Classification Search
CPC ............................................. H01L 33/022433
USPC ........................................................ 257/437
See application file for complete search history.

(56) References Cited

U.S. PATENT DOCUMENTS

| | | | |
|---|---|---|---|
| 4,443,652 A * | 4/1984 | Izu et al. ...................... 136/251 |
| 2002/0076919 A1* | 6/2002 | Peters ............... H01L 23/49822 438/637 |
| 2005/0275057 A1* | 12/2005 | Breen et al. ................... 257/480 |
| 2006/0180195 A1* | 8/2006 | Luch ............................ 136/244 |
| 2007/0283996 A1* | 12/2007 | Hachtmann ............ H02S 20/23 136/244 |
| 2008/0142071 A1* | 6/2008 | Dorn .................... H05K 1/0293 136/245 |
| 2008/0216887 A1* | 9/2008 | Hacke ................. H01L 31/0516 136/244 |
| 2010/0074515 A1* | 3/2010 | Zhao et al. .................... 382/149 |
| 2010/0190290 A1* | 7/2010 | Rana et al. ..................... 438/98 |
| 2010/0240169 A1* | 9/2010 | Petti et al. ...................... 438/68 |
| 2010/0298965 A1 | 11/2010 | Liu et al. |
| 2011/0284986 A1* | 11/2011 | Rim et al. ..................... 257/510 |

* cited by examiner

*Primary Examiner* — Igwe U Anya
(74) *Attorney, Agent, or Firm* — Arent Fox LLP

(57) ABSTRACT

An optoelectronic device including at least one of a solar device, a semiconductor device, and an electronic device. The device includes a semiconductor unit. A plurality of metal fingers is disposed on a surface of the semiconductor unit for electrical conduction. Each of the metal fingers includes a pad area for forming an electrical contact. The optoelectronic device includes a plurality of pad areas that is available for connection to a bus bar, wherein each of the metal fingers is connected to a corresponding pad area for forming an electrical contact.

14 Claims, 9 Drawing Sheets

DEVICE FOR INDIVIDUAL FINGER ISOLATION IN AN OPTOELECTRONIC DEVICE

RELATED APPLICATIONS

This application is a continuation (divisional) application of the U.S. patent application Ser. No. 13/222,310 by A. Hegedus, filed on Aug. 31, 2011, entitled "DEVICE AND METHOD FOR INDIVIDUAL FINGER ISOLATION IN AN OPTOELECTRONIC DEVICE," which is hereby incorporated by reference in its entirety.

BACKGROUND

As fossil fuels are being depleted at ever-increasing rates, the need for alternative energy sources is becoming more and more apparent. Energy derived from wind, from the sun, and from flowing water offer renewable, environmentally friendly alternatives to fossil fuels, such as coal, oil and natural gas. Being readily available almost anywhere on Earth, solar energy may someday be a viable alternative.

To harness energy from the sun, the junction of a solar cell absorbs photons to produce electron-hole pairs, which are separated by the internal electric field of the junction not to generate a voltage, thereby converting light energy to electrical energy. One or more solar cells may be combined together on solar panels. An inverter may be coupled to several solar panels to convert direct current power to alternating current power.

The currently high cost of producing solar cells relative to the low efficiency levels of contemporary devices heretofore has presented solar cells from becoming a mainstream energy sources, and has limited the applications to which solar cells may be suited. Compounding the problem are defective solar cells that may be by themselves unusable, but also may render a group of solar cells unusable, especially when the defect is fatal. Accordingly, there is a need for salvaging expensive, yet defective solar cells rather than discarding them.

SUMMARY

Embodiments of the present invention generally relate to devices and methods for converting electromagnetic radiation, such as, solar energy, into electrical energy that are able to isolate defective portions of a solar cell, so that remaining active portions of the solar cell may still be used for energy production.

In one embodiment, an optoelectronic device is disclosed including at least one of a solar device, a semiconductor device, and an electronic device. The device includes a semiconductor unit. A plurality of metal fingers is disposed on a surface of the semiconductor unit for electrical conduction. Each of the metal fingers includes a pad area for forming an electrical contact. The optoelectronic device includes a plurality of pad areas that is available for connection to a bus bar, wherein each of the metal fingers is connected to a corresponding pad area for forming an electrical contact.

In one embodiment, an optoelectronic device comprising a film stack material is configured for electrical connection. The film stack material (e.g., thin film stack, etc.) includes a p-n layer such that electrical energy is created when photons are absorbed by the p-n layer. A plurality of metal fingers is disposed on a surface of the p-n layer for electrical conduction. Each of the metal fingers includes a pad area for forming an electrical contact. A dielectric coating (e.g., anti-reflective coating) is disposed above the plurality of metal fingers and the surface. Also, at least one blind via through the dielectric coating provides access to a corresponding pad area. The film stack material includes at least one pad area that is electrically isolated, such that no blind via is present to provide access to a corresponding isolated pad area. In a separate step, a bus bar is put down and connected to selected pad areas for electrical connection via corresponding blind vias.

In another embodiment, a device is disclosed that includes two or more optoelectronic devices, such as, photovoltaic devices. A first optoelectronic device is included and comprises a first p-n layer such that electrical energy is created when photons are absorbed by the first p-n layer; a first plurality of metal fingers on a surface of the first p-n layer for electrical conduction, wherein each of the metal fingers includes a pad area for forming an electrical contact; a first dielectric coating (e.g., anti-reflective coating) disposed above the first plurality of metal fingers and the surface; a first plurality of blind vias through the first anti-reflective coating, wherein each of the blind vias provide access to a corresponding pad area; and a pad area that is electrically isolated, such that no blind via is present to provide access to the pad area. A second optoelectronic device is included and is overlaid the first optoelectronic device, and comprises a semiconductor device layer; a metal backing layer disposed under the semiconductor device layer; a buffer layer under the metal backing layer; and a second plurality of blind vias filled with electrically conductive material, each of which provide access to the metal backing layer. The plurality of vias is aligned with the first plurality of blind vias to provide electrical connection between pad areas of the first plurality of metal fingers of the first optoelectronic device to the metal backing layer of the second optoelectronic device. However, the metal layer is not electrically connected to the pad area that is electrically isolated.

In still another embodiment, a method for fabricating an optoelectronic device including at least one of a solar device, a semiconductor device, and an electronic device, is disclosed and comprises: providing a semiconductor unit; forming a plurality of metal fingers on a surface of the semiconductor unit for electrical conduction; forming a plurality of pad areas available for connection to a bus bar, wherein each of the metal fingers includes a corresponding pad area for forming an electrical contact; forming a dielectric coating (e.g., anti-reflective coating) disposed above the plurality of metal fingers and the surface; performing an integrity test to determine an integrity of a plurality of sections of the optoelectronic device to distinguish between good sections and bad sections of the optoelectronic device, each section corresponding to one of the plurality of metal fingers; and electrically opening a good section and maintaining electrical isolation of the bad section, wherein the bad section corresponds to a compromised finger metal and compromised pad area.

These and other objects and advantages of the various embodiments of the present disclosure will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Accordingly, embodiments of the present disclosure illustrate an optoelectronic device (e.g., a photovoltaic device) that includes a plurality of metal fingers available for connection to an external bus bar, wherein one of the metal fingers is electrically isolated to reduce or eliminate the effects of a manufacturing defect. In that manner, a defect in an optoelectronic device may be electrically isolated, thereby restoring the integrity of a previously defective device, though at reduced operational power.

Embodiments of the present invention are described within the context of providing electrical isolation of a metal finger of an optoelectronic device. Examples of such optoelectronic devices include but are not limited to photovoltaic devices, solar devices, semiconductor devices, and any electronic devices (e.g., diodes, light emitting diodes (LEDs), etc.).

Figure 1A:
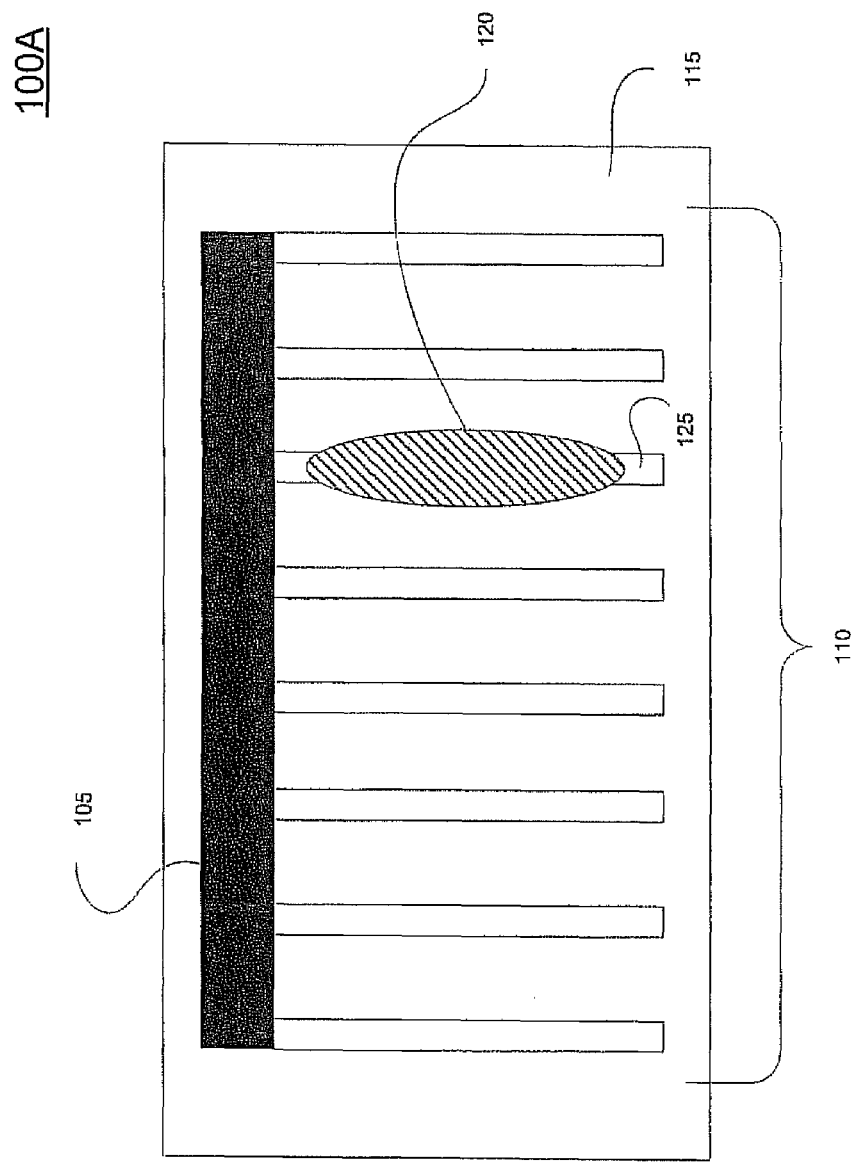
FIG. 1A is a plan view of an optoelectronic device showing an integrated bus bar connected to a plurality of metal fingers and a potentially fatal defect.
Figure 1B:
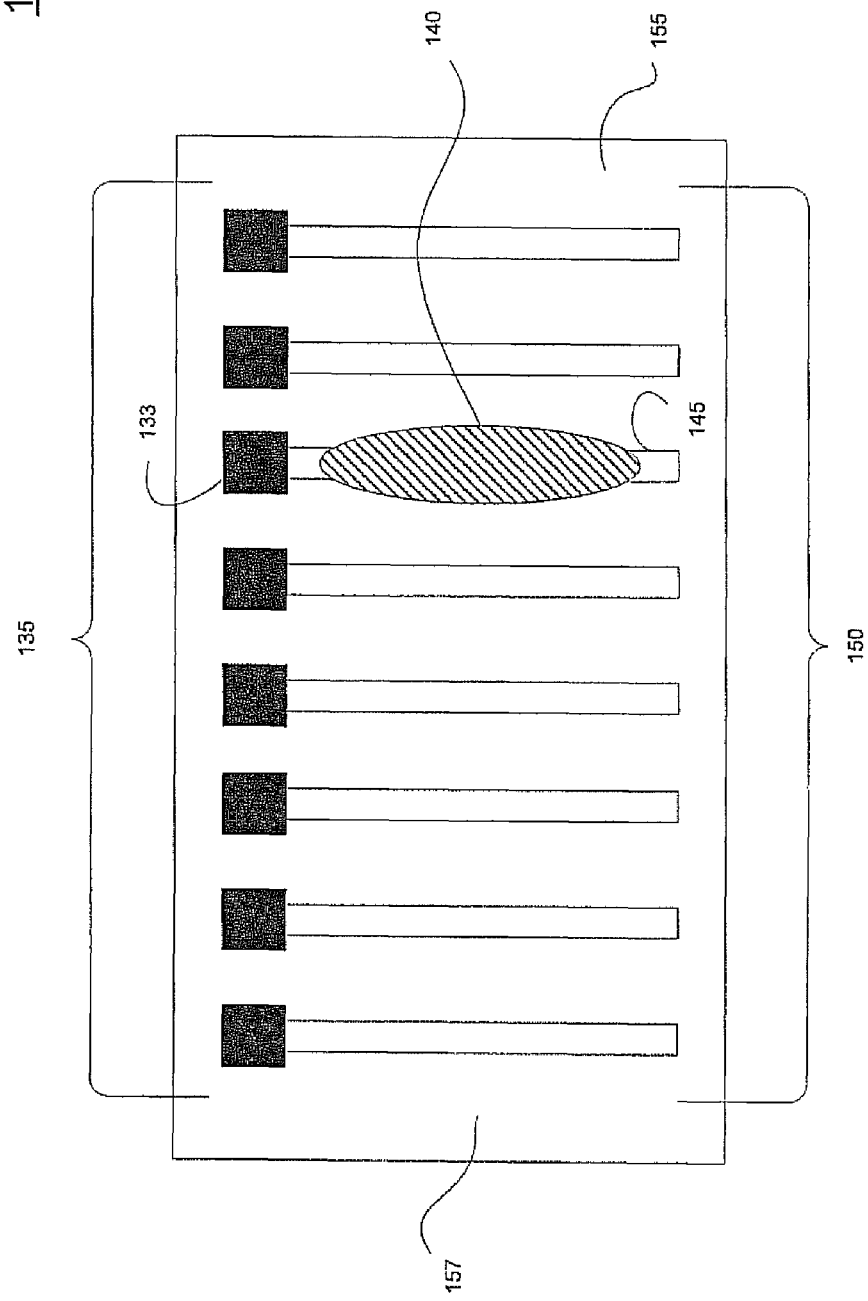
FIG. 1B is a plan view of an optoelectronic device showing a segmented bus bar connected to a plurality of metal fingers and a defect, in accordance with one embodiment of the present disclosure.
Figure 1C:
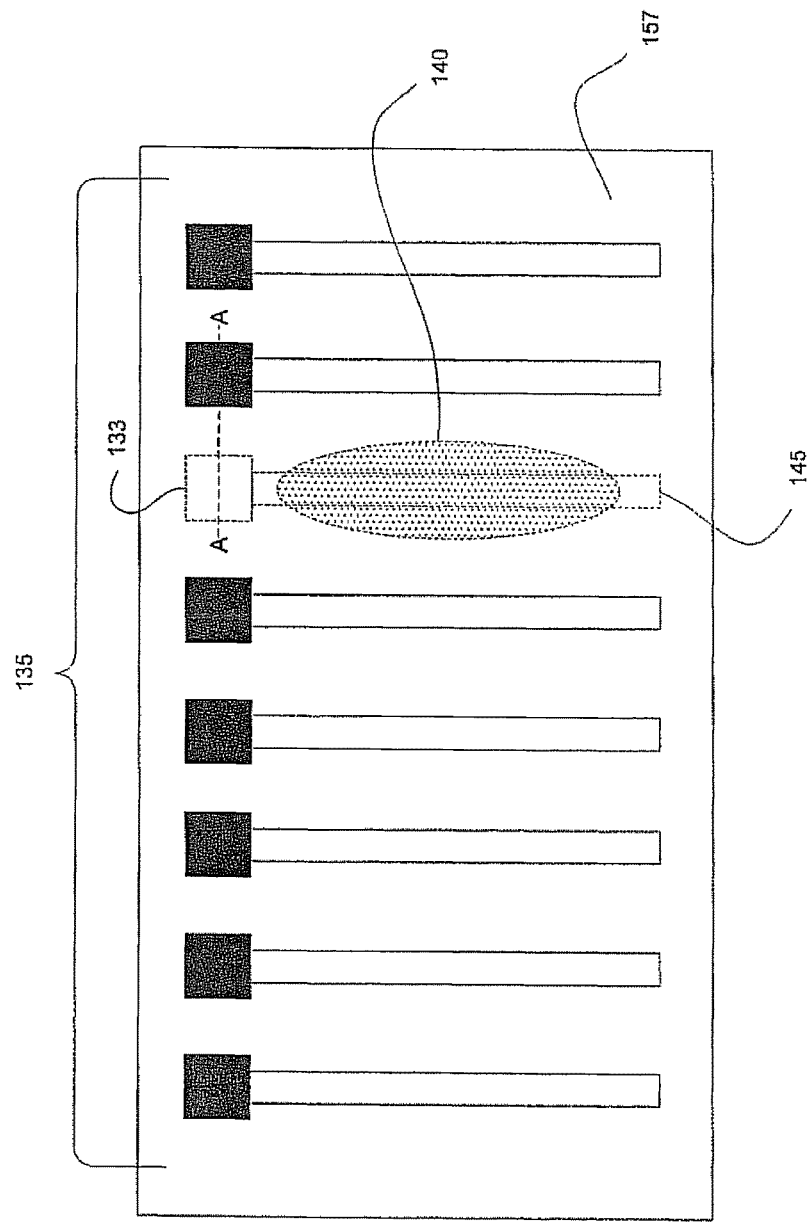
FIG. 1C is a plan view of an optoelectronic device showing a segmented bus bar connected to a plurality of metal fingers and an isolated metal finger that is associated with a defect, in accordance with one embodiment of the present disclosure.

FIG. 1A-C are diagrams of optoelectronic devices including a potentially fatal defect that through embodiments of the present invention are electrically isolated. The defects in the optoelectronic devices may range in severity from inconsequential to severe, and stem from imperfect manufacturing techniques. An inconsequential defect has little or no affect on the operation of the device. On the other hand, a potentially fatal defect severely and negatively impacts the operation of the device. For instance, a fatal defect may describe a short from a metal finger to an underlying metal layer of the device that does not allow current to flow to an external load for power capture. Typically, any discoverable defect in a device would render that device unusable as the chance that the defect be fatal may compromise the overall integrity of a solar panel including multiple devices, including the defective device. However, embodiments of the present invention are configurable to isolate the defect, no matter the severity, thereby restoring the integrity of the device for operational use.

In particular, FIG. 1A illustrates a plan view of an optoelectronic device 100A showing an integrated bus bar 105 connected to a plurality of metal fingers 110 and a potentially fatal defect 120. The plurality of metal fingers 110 is adjacent to a p-n layer 115 that generates electrical energy (e.g., current) when photons are absorbed. In addition, a defect 120 is shown that is in the proximity of metal finger 125. Because the bus bar 105 is contiguous, the defect 120 that adversely affects metal finger 125 is able to affect all of the plurality of metal fingers 110 through the bus bar 105. As such, if the defect is severe, such as, a short connecting both sides of the underlying p-n junction, then that defect will affect the entire device 100A, thereby rendering the device 100A defective.

FIG. 1B is a plan view of an optoelectronic device showing a plurality of metal fingers 150 available for connection to a bus bar (not shown), in accordance with one embodiment of the present disclosure. The plurality of metal fingers 150 is adjacent to a semiconductor unit 155 having a surface 157. For instance, in one embodiment, the semiconductor unit 155 comprises an underlying p-n layer that generates electrical energy (e.g., current) when photons are absorbed.

More particularly, each of the plurality of metal fingers 150 is isolated from the other fingers. For instance, instead of having a contiguous bus bar as a layer that connects to all of the plurality of metal fingers 150, a plurality of electrically conductive landing pads 135 is disposed adjacent to the plurality of metal fingers 150 that is available for connection to the bus bar. In particular, a landing pad is disposed adjacent to a corresponding metal finger. As will be described later, the landing pads can then be connected together through any suitable means, such as, via conductive leads, or as will be further described below, to an external bus bar, or to a metal plate acting as an external bus bar of an adjoining device.

In addition, a defect 140 is shown that is in the proximity of metal finger 145. Because of the configuration of the landing pads 135 and its connection to an external bus bar, the defect 140 is isolated to metal finger 125, through embodiments of the present invention. In particular, isolation is achieved by electing not to connect landing pad 133, that is connected to metal finger 145, to the remaining plurality of landing pads 135 through an external bus bar.

For instance, FIG. 1C is a plan view of an optoelectronic device 100C showing the isolation of a metal finger, in accordance with one embodiment of the present disclosure. The device 100C takes the defect 140 present in the device 100B of FIG. 1B, and isolates that defect in order to restore the operational integrity of the device 100C. In particular, the defect 140 is shown again in the proximity of metal finger 145, and adversely affects the purposeful operation of metal finger 145. However, landing pad 133 that is connected to metal finger 145 is shown in FIG. 1C as being isolated (e.g., not filled in) from the remaining landing pads. Isolation of landing pad 133 is achieved by maintaining a dielectric layer disposed over the surface 157 of the semiconductor layer over pad 133 such that no electrical connectivity is made to an external bus bar, and is described further in relation to FIGS. 2A-B and 3 below. Moreover, one or more landing pads associated with one or more defects may be electrically isolated from the remaining landing pads. In that manner, the landing pads in the plurality of landing pads 135 that are not isolated (e.g., filled in) can then be connected together through any suitable means, such as, through conductive leads, an external bus bar, or as will be further described below, to a metal plate of an adjoining device acting as an external bus bar.

Figure 2A:
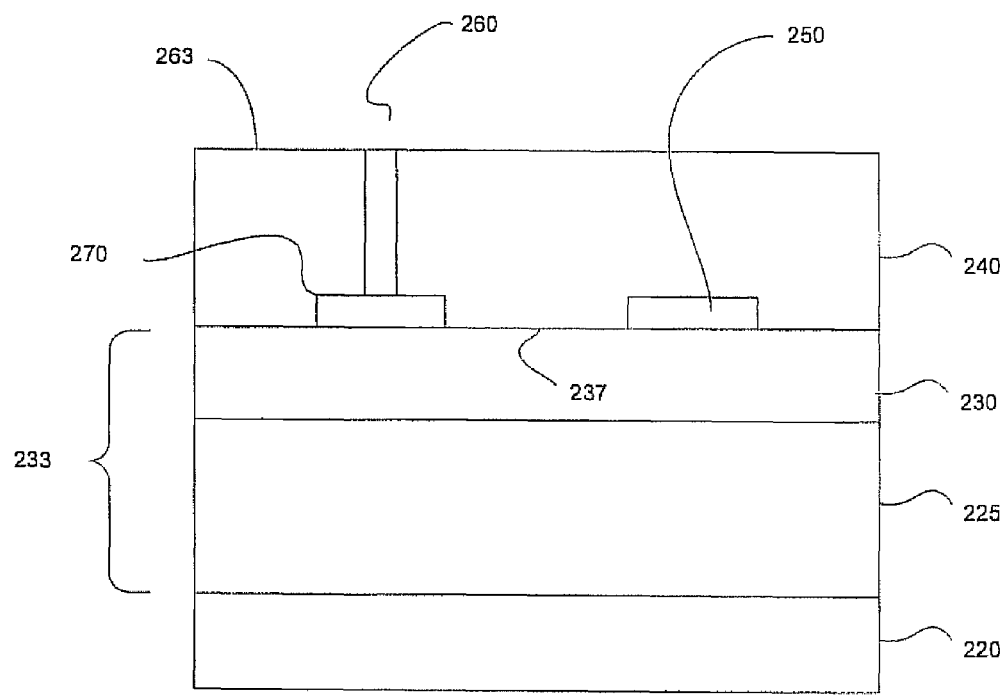
FIG. 2A is a cross-sectional view of an optoelectronic device showing an isolated metal finger, in accordance with one embodiment of the present disclosure.

FIG. 2A is a cross-sectional view of an optoelectronic device 200A (e.g., a solar/photovoltaic device, a semiconductor device, an electronic device, etc.) showing an isolated metal finger, in accordance with one embodiment of the present disclosure. Device 200A may be representative of any semiconductor device, such as, a solar cell, light emitting diode (LED), etc. For instance, the cross-section shown in FIG. 2A may be representative of a portion of the device 100C shown in FIG. 1C that is taken along lines A-A. In particular, FIG. 2A illustrates various epitaxial layers of the device 200A in cross-section during fabrication. The various layers may be formed using any suitable method for semiconductor growth, such as, molecular beam epitaxy, or metal-organic chemical vapor deposition, on a substrate (not shown).

As shown, in FIG. 2A, at least one layer 220 may perform one or more functions. For instance, layer 220 may provide a buffer for protection, mechanical support, electrical contact, a window, and/or optical reflection, to name a few. In addition, layer 220 may include multiple layers that are grown and removed during the fabrication process. In this manner, embodiments of the present invention may be fabricated by performing epitaxial lift off (EPO) for removing various layers.

As shown, a semiconductor unit 233 is disposed over layer 220. The semiconductor unit includes one or more active components each performing a function. In one embodiment, semiconductor unit 233 comprises a p-n layer that generates electrical energy (e.g., current) when photons are absorbed by the p-n layer. In the p-n layer, a base layer 225 is grown, and an emitter layer 230 is grown adjacent to the base layer. The combination of the base layer and the emitter layer forms a heterojunction that acts as an absorber layer or p-n layer 233 for absorbing photons. In various embodiments, the emitter and base layers may be n-doped or $p^+$-doped in various combinations. For instance, in one embodiment, emitter layer 230 is a $p^+$-doped layer with a surface 237, and adjacently disposed base layer 225 is n-doped. In another embodiment, emitter layer 230 is an n-doped layer with surface 233, and adjacently disposed base layer 225 is $p^+$-doped. In particular, when light is absorbed near the p-n layer 233 to produce electron-hole pairs, the built in electric field may force the holes to the n-doped side and electrons to the $p^+$-doped side. This displacement of free charges results in a voltage difference between the two layers in the p-n layer 233 such that electron current may flow when a load is connected across terminals or contact regions (not fully shown) coupled to these layers. The various thicknesses and relational dimensions of the multiple layers in device 200A of FIG. 2A, as well as the other figures in this application, are not drawn to scale and may vary between devices.

A plurality of metal fingers (not shown) is disposed on a surface 237 of the semiconductor unit 233 for electrical conduction, as described above. More particularly, each of the metal fingers includes a landing pad area for forming an electrical contact. The plurality of pad areas may be electrically connected together through any suitable means, such as, an external bus bar, leads, etc.

Layer 240 is shown disposed on top of surface 237 of the semiconductor unit 233. Layer 240 includes material forming a dielectric. In one embodiment, the dielectric comprises an anti-reflective coating (ARC) to reduce the reflection of photons incident on the semiconductor unit 233. In one implementation, where the semiconductor unit 233 comprises a p-n layer the ARC layer helps to increase the number photons absorbed by the p-n layer. As such, the metal fingers and pad areas are partially surrounded by the layer 240.

As shown in FIG. 2A, pad area 270 is connected to a via (e.g., blind via) 260 that is filled with electrically conductive material. Via 260 is formed within layer 240, and is exposed through top surface 263. Any suitable means for creating a via may be used, such as, through laser or other types of abrasion, chemical process formation, etc. In that manner, pad area 270 may be electrically connected to other similarly accessible pad areas of the device 200A through an external bus bar (not shown).

In addition, pad area 250 is also shown in FIG. 2A. Pad area 250 is not connected to a via or blind via, and as such is electrically isolated. That is, pad area 250 cannot be electrically coupled to other pad areas through an external bus bar (not shown). In that manner, any defect in the device that propagates through the metal finger connected to the pad area 250 cannot further propagate to the other metal fingers of the device.

Figure 2B:
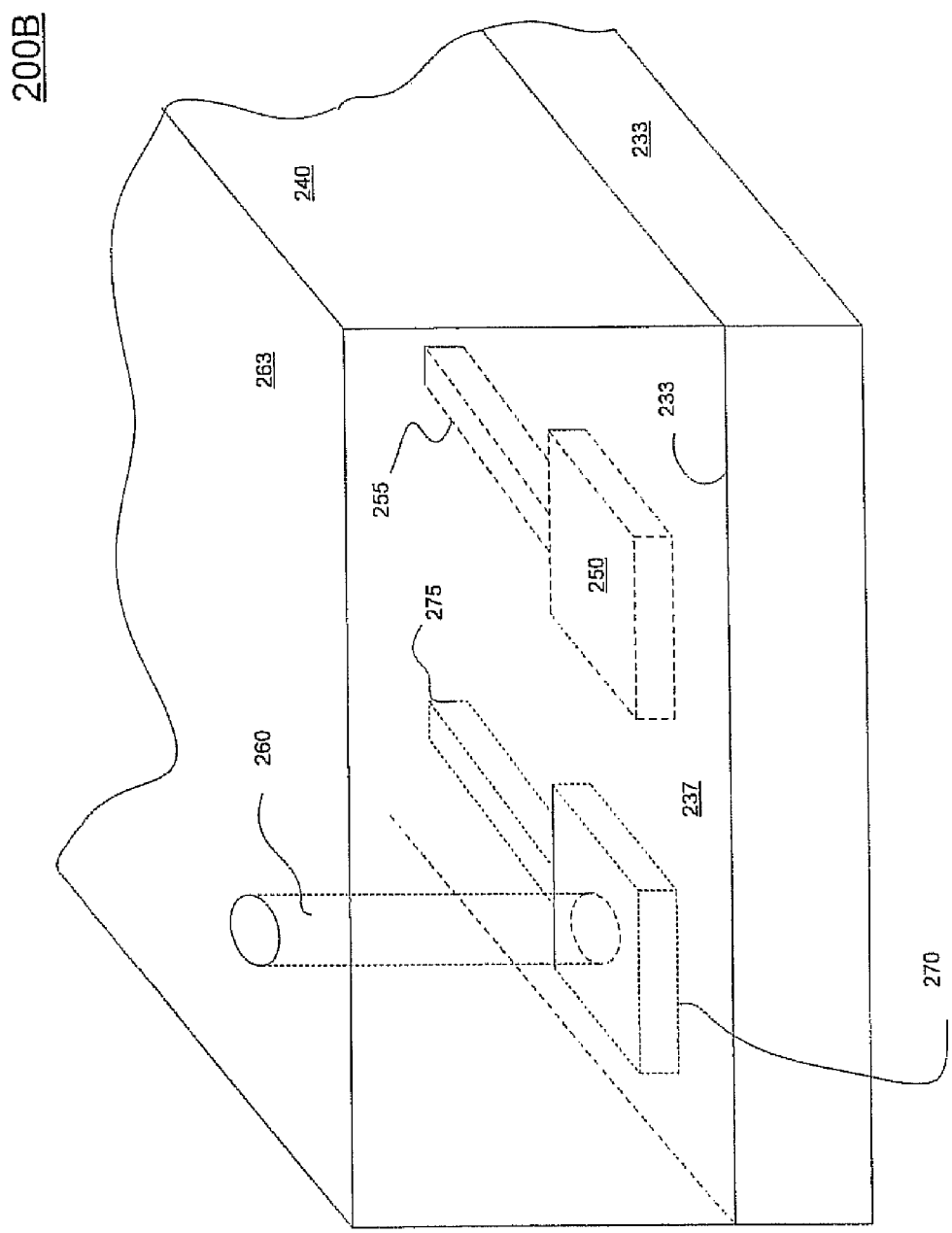
FIG. 2B is a cross-sectional view of an optoelectronic device including a back plate metal layer, and showing an isolated metal finger, in accordance with one embodiment of the present disclosure.

FIG. 2B illustrates a perspective view of an optoelectronic device 200B showing an isolated metal finger, in accordance with one embodiment of the present disclosure. In one embodiment, optoelectronic device 200B provides another view of device 200A of FIG. 2A. As shown, pad area 270 is connected to metal finger 275, wherein metal finger 275 is electrically coupled to the surface 237 of the semiconductor unit 233. Blind via 260 is shown within layer 240 and is exposed at top layer 263. In that manner, further connections may be made to other pad areas of the device through corresponding vias and through a bus bar (e.g., external bus bar).

Additionally, pad area 250 is shown connected to metal finger 255, wherein metal finger 255 is electrically coupled to the surface 237 of semiconductor unit 233. Pad area 250 is electrically isolated in that no via is connected to the pad area 250. As such, metal finger 255 and metal pad 250 cannot be electrically coupled to other pad areas and metal fingers of device 200B.

Figure 2C:
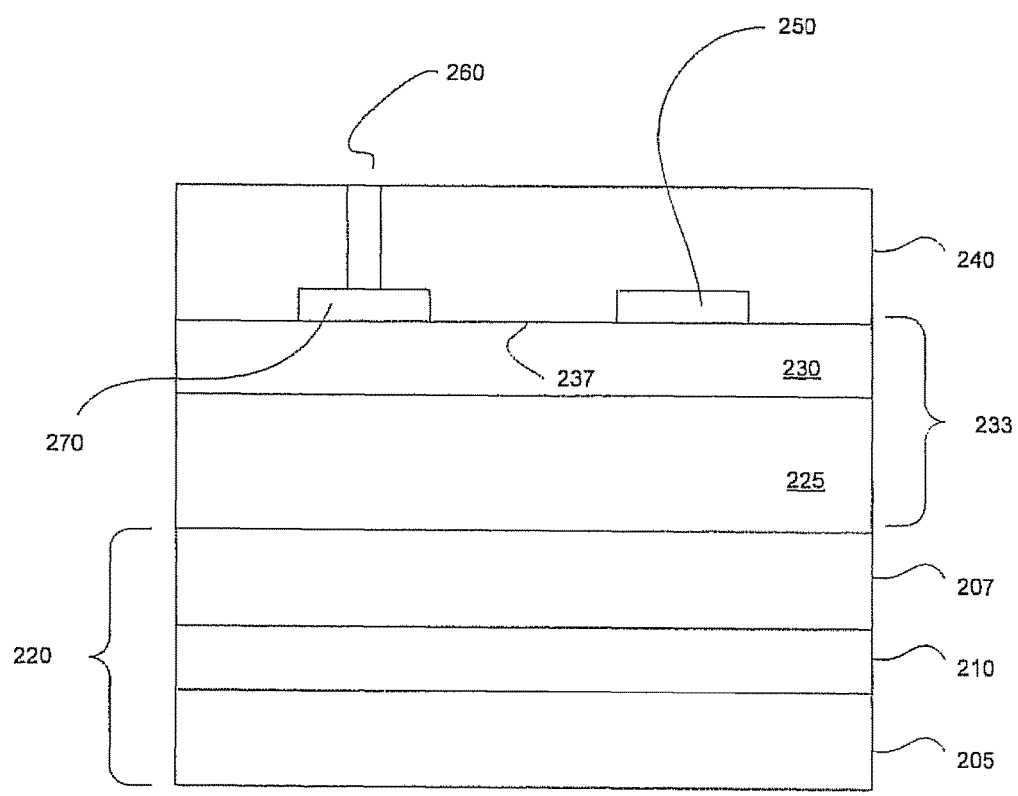
FIG. 2C is a perspective view of the optoelectronic device of FIG. 2A showing an isolated metal finger, in accordance with one embodiment of the present disclosure.

FIG. 2C is a cross-sectional view of various layers of an optoelectronic device 200C (e.g., a solar/photovoltaic device, a semiconductor device, an electronic device, etc.) showing an isolated metal finger, in accordance with one embodiment of the present disclosure. For instance, the cross-section shown in FIG. 2C may be representative of a portion of the device 100C shown in FIG. 1C that is taken along lines A-A. In particular, FIG. 2C illustrates various epitaxial layers of the device 200B in cross-section during fabrication. The various layers may be formed using any suitable method for semiconductor growth, such as, molecular beam epitaxy, or metal-organic chemical vapor deposition, on a substrate (not shown).

In particular, device 200C expands on layer 220 of device 200A of FIG. 2A. For instance, layer 220 may include buffer layers 205 and 207 surrounding a metal layer 210. These layers are disposed below the semiconductor unit 233. In one embodiment, metal layer 210 may be electrically coupled to a plurality of landing pad areas of an underlying optoelectronic device. In that manner, the overlaid pads are configured in series for building voltage. As such, a fabric of optoelectronic devices is created, wherein the plurality of landing pad areas are all electrically coupled through corresponding metal layers.

Figure 3:
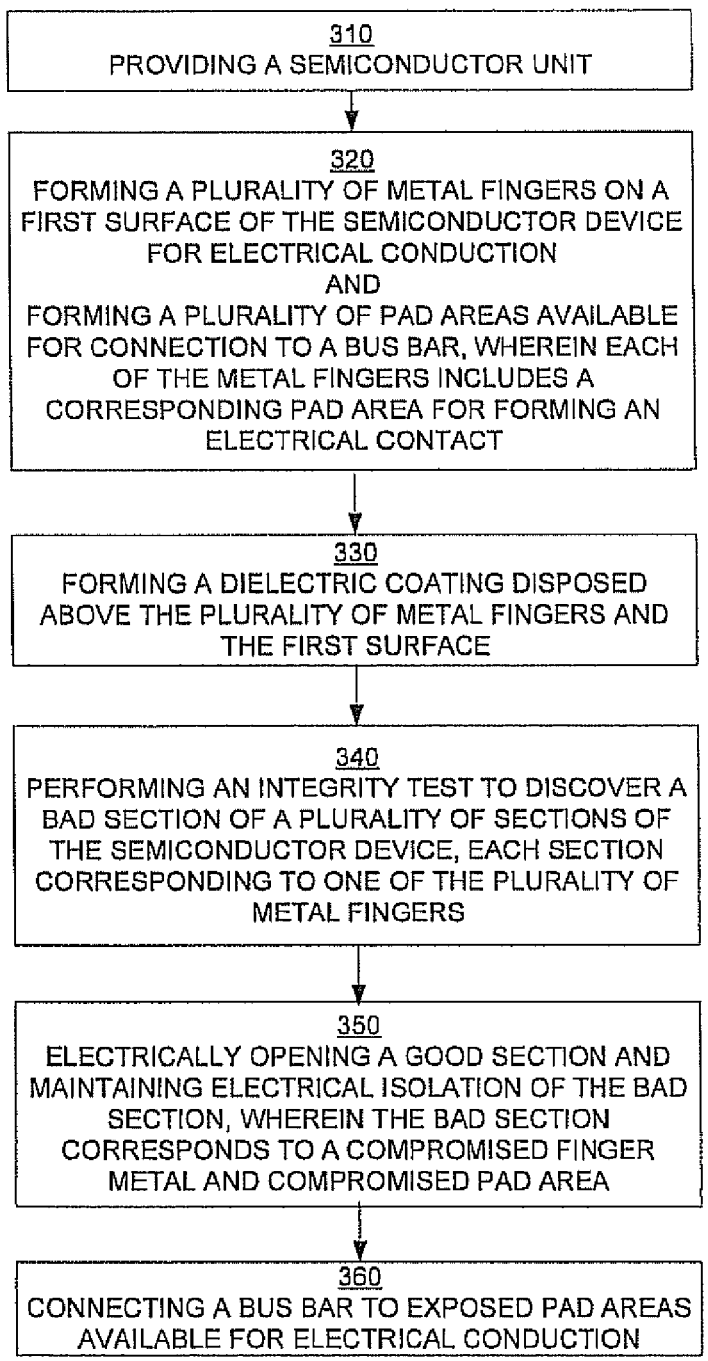
FIG. 3 is a flow chart of a method for fabricating an optoelectronic device including a plurality of landing pad areas connected to a plurality of metal fingers and an isolated metal finger that is associated with a defect, in accordance with one embodiment of the present disclosure.

FIG. 3 is a flow chart 300 of a process used for fabricating an optoelectronic device (e.g., solar/photovoltaic device, a semiconductor device, an electronic device, etc.) that allows for an electrically conductive metal finger to be electrically isolated, in accordance with one embodiment of the present disclosure. In that manner, defects of the thin film stack material and/or device may be electrically isolated.

At 310, a semiconductor unit is provided. In one embodiment, the semiconductor unit comprises a p-n layer such that electrical energy is created when photons are absorbed by the p-n layer. The device may be representative of any optoelectronic device, such as, a semiconductor device, a photovoltaic device or solar cell, LED, etc.

At 320, a plurality of metal fingers is formed on a first surface of the semiconductor unit for electrical conduction. For instance, in the case where the semiconductor unit comprises a p-n layer, the metal fingers provide electrical conduction so that electrical energy may be collected from the excitation of the p-n layer. Specifically, electron current may flow from the p-n layer in response to the absorption of photon energy through the plurality of metal fingers, when a load is connected to terminal or contact regions coupled to the layers of the p-n layer.

A plurality of landing pad areas is also formed. Each of the pad areas is connected to a corresponding metal finger, and provides for forming an electrical contact that is associated with the metal finger. In that manner, connections can be made to the pad areas to electrically couple the metal fingers together. Further, the landing pad areas are available for connection to a bus bar (e.g., external or internal bus bar). In one embodiment, the pad areas are formed simultaneous with the formation of the metal fingers.

At 330, a buffer layer or dielectric coating is disposed over the plurality of metal fingers and the surface of the semiconductor unit. Specifically, a dielectric coating is disposed above the plurality of metal fingers, their corresponding pad areas, and the surface of the semiconductor unit. In one embodiment, the dielectric coating is an anti-reflective coating. In that manner, the dielectric coating partially surrounds the metal fingers and their corresponding pad areas. For instance, the dielectric coating comprises an ARC coating to aid in the absorption of photon energy. Additionally, the dielectric coating is used to electrically isolate a metal finger and a connected pad area from other metal fingers and pad areas of the device, as will be described below.

At 340, the operational integrity of the device is tested. In particular, an integrity test is performed to determine the operational integrity of a plurality of sections of the device. Each section of the device corresponds to one of the plurality of metal fingers. As such, through the test a defect in any section is readily discoverable through the performance of the integrity test. The bad or defective section is associated with a finger metal and corresponding pad area, identified as compromised finger metal and compromised pad area. Additionally, locational or dimensional characteristics are calculated in order to identify the location of the bad section, defect, corresponding compromised pad area, or corresponding compromised finger metal.

Various tests may be performed to check the operational integrity of the device. For instance, in one embodiment, the device may be exposed to a photoluminescence operation, such that a section containing a defect will emit a wavelength that is different from the wavelengths emitted from sections that do not contain a defect. In that manner, the bad section is marked through photoluminescence. In another embodiment, the sections may be tested by electrically stimulating each of the plurality of metal fingers that are associated with the plurality of sections to identify a bad section. Specifically, if there is a short in a bad section, by stimulating the metal finger associated with that bad section, current will flow through that short. As such, the presence of electrical conduction in a section indicates that it is a bad section. In still another embodiment, an image of the device may be taken during fabrication. Certain defects will exhibit identifiable characteristics that are visible through imaging. In that manner, once that characteristic is discovered for a particular section of a device, that section is then associated with having a defect.

At 350, once a bad section is discovered, that section is electrically isolated. In particular, a corresponding portion of the dielectric coating that partially surrounds the compromised finger metal and compromised pad area is left intact. That is, instead of removing the portion of the dielectric coating to provide for conductive access the underlying pad area, it is left intact, in order to maintain the electoral isolation of the compromised pad area. In that manner, the compromised finger metal and compromised pad area remain encapsulated by the dielectric coating.

As such, during the fabrication process one or more pad areas are exposed for electrical conduction by removing corresponding portions of the dielectric coating. The removed portions form a plurality of blind vias that are then filled with electrically conductive material to provide for conductive access to the metal fingers. For instance, blind vias may be created through laser ablation, in which a laser is directed to abrade or remove portions of the dielectric coating in order to access corresponding pad areas. In particular, pad areas associated with good sections of the device are configured for conductive access and/or coupling. Alternatively, bad sections are isolated by skipping the step of removing the corresponding portion of the anti-reflective coating. For instance, the laser is not directed to the location exposing the compromised pad area, and as such, the compromised pad area remains encapsulated by the anti-reflective coating.

In still another embodiment, the compromised metal finger and/or compromised metal pads are removed. For instance, during the laser removal process, instead of just removing corresponding portions of the dielectric coating, the laser is used to remove the compromised metal finger and compromised metal pads. In that manner, no electrical connection can be made to the corresponding metal fingers.

In still another embodiment, the identification of a defective section and isolation of that section is performed before formation of the dielectric coating. In that case, when a defective section is discovered, a buffer material, or electrically isolating material may be formed over the compromised metal finger and compromised pad area to encapsulate those two items over the surface of the p-n layer. Thereafter, the fabrication steps continue, such as, forming an anti-reflective coating, etc.

At 360, a bus bar is connected to the exposed pad areas available for electrical conduction and that are associated with good sections of the device. In one embodiment, the bus bar is a metal layer of an overlying device that is accessible through the backside of the overlying device.

Figure 4A:
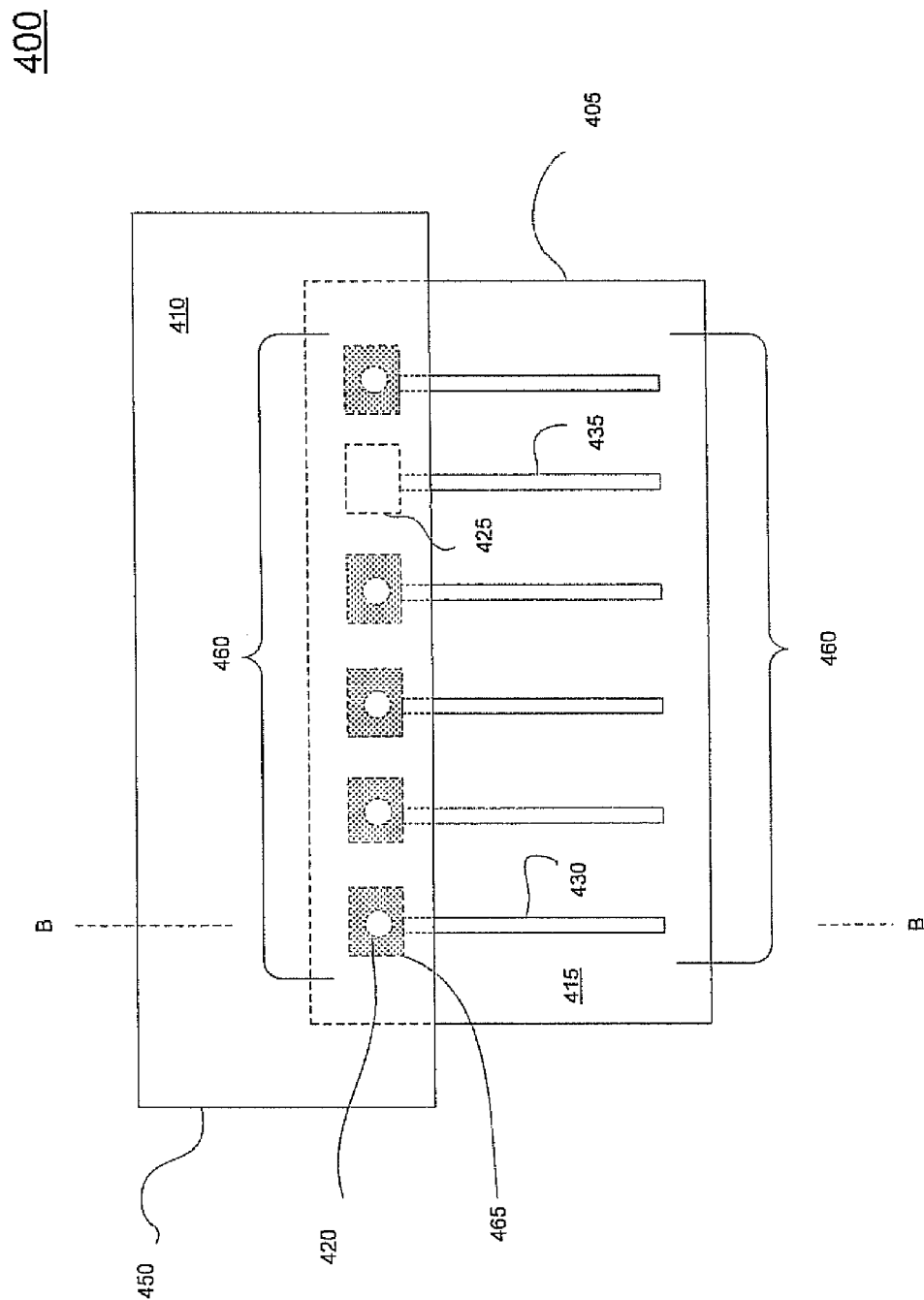
FIG. 4A is a plan view of a fabric including one or more interconnected optoelectronic devices, including one optoelectronic device that comprises a segmented bus bar connected to a plurality of metal fingers and an isolated metal finger that is associated with a defect, in accordance with one embodiment of the present disclosure.

FIG. 4A is a plan view of a fabric 400 including one or more interconnected optoelectronic devices, including one device 450 that comprises a metal layer acting as a bus bar that is connected to a plurality of metal fingers 460 of an underlying device 405, in accordance with one embodiment of the present disclosure. The underlying device 405 includes an electrically isolated metal finger 435 that is associated with a defect, and that is not connected to the bus bar, in accordance with another embodiment of the present disclosure. Although FIG. 4A shows two devices 405 and 450 interconnected in series to build voltage, it is contemplated that more than two devices may be interconnected in similar fashion to create a larger fabric. Also, in other embodiments, devices may be interconnected in parallel through one or more external bus bars for building current.

As shown in FIG. 4A, device 405 includes a plurality of metal fingers 460 that is disposed on a surface 415 of a semiconductor unit for electrical conduction. More particularly, each of the metal fingers is connected to a corresponding landing pad area (pixilated) for forming an electrical contact. For instance, pad area 465 is connected to metal finger 430. In addition, pad area 425 is connected to metal finger 435.

The plurality of pad areas 460 is available for connection to an external bus bar, as previously described. As shown in FIG. 4A, the external bus bar is included in device 420, such as, a metal layer in device 420. Pad areas in the device 405 may be electrically connected and/or coupled together. For instance, a blind via filled with electrically conductive material extends from a surface 415 of the device 405 down to a corresponding pad area. For instance, via 420 is connected to landing pad area 465. By connecting to respective vias connected to underlying pad areas, electrical current will flow to be converted to energy and power.

In embodiments of the present invention, pad area 425 is electrically isolated from the remaining pad areas when coupling to an external bus bar of device 450. As shown pad area 425 is not pixilated to indicate its isolation. Specifically, pad area 425 is not connected to a corresponding via. As such, pad area 425 is not electrically accessible through the surface 415 of device 400A, as are the remaining pad areas in the segmented bus bar, and thus cannot be connected and/or electrically coupled to the remaining pad areas through the external bus bar of device 450.

Figure 4B:
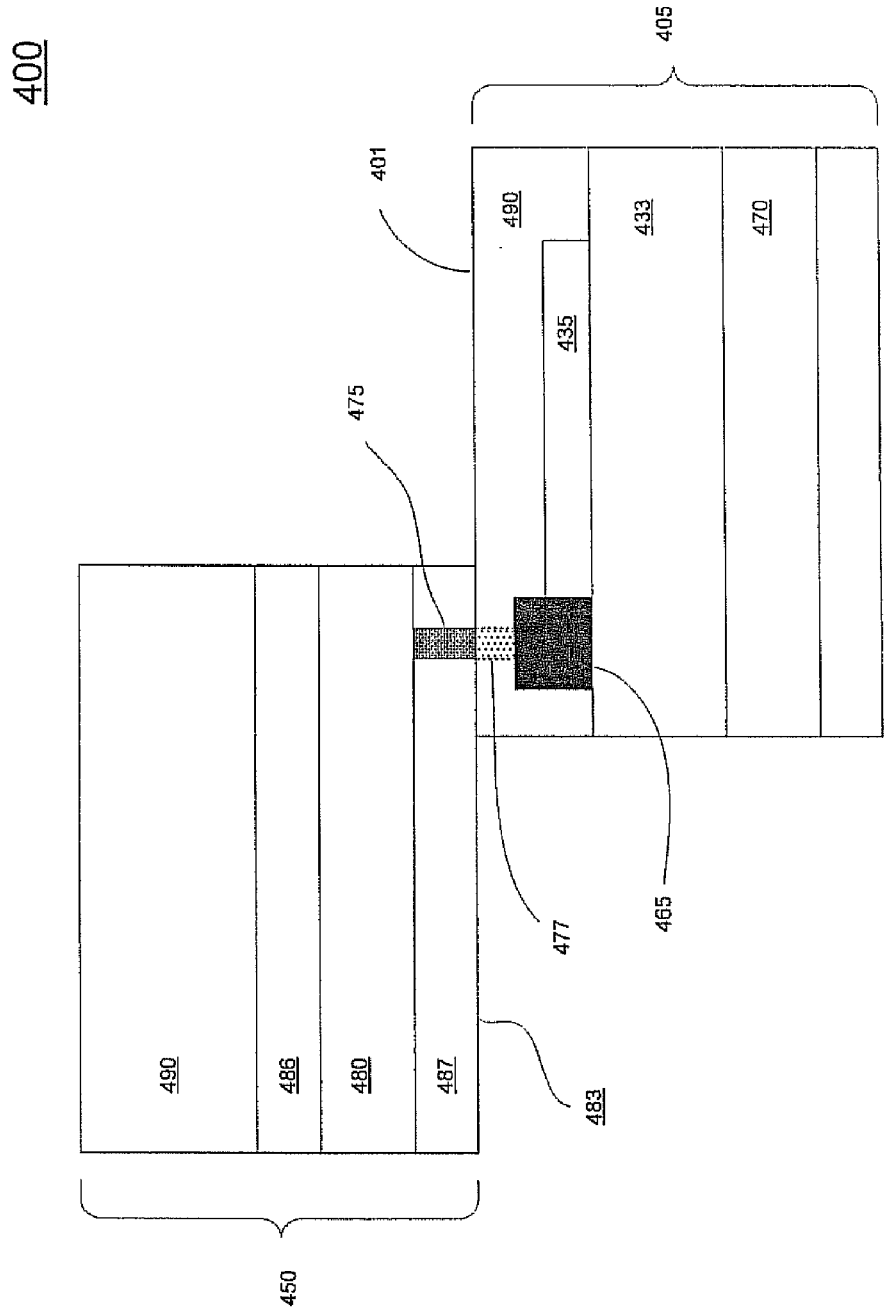
FIG. 4B is a cross-sectional view of the fabric of FIG. 4A illustrating one or more interconnected optoelectronic devices, including one optoelectronic device that comprises a segmented bus bar connected to a plurality of metal fingers and an isolated metal finger that is associated with a defect, in accordance with one embodiment of the present disclosure.

FIG. 4B is a cross-sectional view of the fabric 400 of FIG. 4A illustrating one or more interconnected optoelectronic devices, including one device that comprises a plurality of metal fingers configured for electrical conduction, and an isolated metal finger that is associated with a defect, in accordance with one embodiment of the present disclosure. In particular, the cross-section is taken along line B-B as shown in FIG. 4A.

As shown in FIG. 4B, underlying device 405 includes a pad area 465 that is connected to metal finger 435 that is adjacent to a semiconductor unit 433, such as, a p-n layer. In the case where the unit 433 comprises a p-n layer, electrical energy is created when photons are absorbed by the p-n layer. The pad area 465 and metal finger are encapsulated by a buffer layer 490 (e.g., an anti-reflective coating). Blind via 477 is connected to the pad area 465 and is exposed to the surface 401 of device 405. In that manner, pad area 465 is electrically coupled with other pad devices through their respective vias and an external bus bar, such as, the metal layer 480 of overlaid device 450.

In addition, device 405 includes an electorally isolated pad area (not shown in FIG. 4B), that was previously shown in FIG. 4A. Isolation is achieved by not forming a blind via to the isolated pad area. In that manner, the pad area remains encapsulated by the buffer layer 490 so that it is electrically isolated.

Furthermore, device 450 is shown partially overlapping the device 405. Device 450 is similarly configured as device 405, and both are not fully drawn out for clarity. For instance, device 450 includes a semiconductor device layer 490 (e.g., LED, p-n layer, etc.). Device 450 also includes a metal backing layer 480 disposed under the semiconductor layer 490. A first buffer layer 486 is disposed between the metal backing layer 480 and the semiconductor unit 490. A second buffer layer 487 is disposed under the metal layer 480.

Also, a plurality of blind vias is filled with electrically conductive material, and provides access to the metal backing layer 480 through buffer layer 487 in device 450. The plurality of vias is aligned with the plurality of blind vias providing access to the plurality of pad areas of the underlying device 405. Moreover, the metal layer is not connected to the pad area in device 405 that is electrically isolated (not shown in FIG. 4B). For instance, blind via 475 extends from a bottom surface 483 of device 405 and through the buffer layer 487. Blind via 475 is connected to metal layer 480. Metal layer 480 provides an electrically conductive path for electron flow from each of the coupled pad areas of the underlying device 405. For instance, metal layer 480 is electrically coupled to and connected to pad area 465 through vias 475 and 477. In that manner, metal layer 480 of the overlapping device 450 electrically connects and/or couples each of the plurality of pad areas and corresponding metal fingers of the underlying device 405 through corresponding combination of vias. Further, electrically isolated fingers of device 405 are not connected to the overlaid metal layer 480, and as such remain electrically isolated from the remaining pad areas of device 405.

Thus, according to embodiments of the present disclosure, devices and methods for converting electromagnetic radiation, such as, solar energy, into electrical energy that are able to isolate defective portions of a solar cell are described, so that remaining active portions of the solar cell may still be used for energy production.

While the foregoing disclosure sets forth various embodiments using specific block diagrams, flow charts, and examples, each block diagram component, flow chart step, operation, and/or component described and/or illustrated herein may be implemented, individually and/or collectively. In addition, any disclosure of components contained within other components should be considered as examples because many other architectures can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

The invention claimed is:

1. An optoelectronic device, comprising:
a semiconductor unit;
a plurality of metal fingers disposed on a surface of said semiconductor unit for electrical conduction;
a plurality of pad areas disposed on said surface of said semiconductor unit and available for connection to a bus bar, wherein each of said plurality of metal fingers is connected and adjacently disposed to a corresponding pad area of said plurality of pad areas for forming an electrical contact between respective metal fingers and corresponding pad areas,
wherein said semiconductor unit includes a manufacturing defect in proximity to a first metal finger of said plurality of metal fingers comprising said first metal finger and a corresponding first pad area of said plurality of pad areas; and
a dielectric layer disposed over at least said plurality of pad areas that is selectively configured to electrically isolate said manufacturing defect from the bus bar through isolation of said compromised first metal finger and said compromised first pad area, said dielectric layer being further configured to have at least one blind via through said dielectric layer, and said at least one blind via being filled with electrically conductive material to provide electrical access to said bus bar to remaining pad areas of the plurality of pad areas that are not compromised by said manufacturing defect.

2. The optoelectronic device of claim 1, wherein:
a good section of said semiconductor unit is electrically opened for electrical connection to said bus bar via the at least one blind via, and the remaining pad areas and corresponding metal fingers; and
a bad section area of said semiconductor unit, including said manufacturing defect, is electrically isolated from said bus bar using said dielectric layer.

3. The optoelectronic device of claim 1, wherein said compromised first pad area is associated with a bad section of said semiconductor unit having said manufacturing defect, such that no blind via is present within said dielectric layer to provide electrical access to said bus bar from said compromised first pad area in order to electrically isolate said compromised first pad area.

4. The optoelectronic device of claim 3, wherein said dielectric layer comprises an anti-reflective coating.

5. The optoelectronic device of claim 1, wherein said semiconductor unit comprises:
a p-n layer such that electrical energy is created when photons are absorbed by said p-n layer.

6. The optoelectronic device of claim 5, further comprising:
a metal backing layer disposed below said p-n layer available for electrical coupling to an underlying optoelectronic device.

7. An optoelectronic device, comprising:
a first p-n layer such that electrical energy is created when photons are absorbed by said first p-n layer;
a first plurality of metal fingers disposed on a surface of said first p-n layer for electrical conduction;
a first plurality of pad areas disposed on said surface of said first p-n layer and available for connection to an external bus bar, wherein each of said first plurality of metal fingers is connected and adjacently disposed to a corresponding pad area of said first plurality of pad areas for forming an electrical contact between respective metal fingers and corresponding pad areas,
wherein said first p-n layer includes a manufacturing defect in proximity to a first metal finger of said first plurality of metal fingers compromising said first metal finger and a corresponding first pad area of said first plurality of pad areas; and
a first dielectric layer disposed above said first plurality of metal fingers, said first plurality of pad areas, and said surface, wherein said first p-n layer includes a good section that is electrically opened for electrical connection to said external bus bar via remaining pad areas of said first plurality of pad areas that are not compromised by said manufacturing defect, and a bad section having said manufacturing defect and that is electrically isolated from said external bus bar by using said first dielectric layer to isolate said compromised first metal finger and said compromised first pad area,
wherein said first dielectric layer includes a first plurality of blind vias filled with electrically conductive material to provide electrical access to said external bus bar for said remaining pad areas.

8. The optoelectronic device of claim 7, wherein said compromised first pad area is associated with said bad section having said manufacturing defect, such that no blind via is present within said dielectric layer to provide electrical access to said external bus bar from said compromised first pad area in order to electrically isolate said compromised first pad area.

9. The optoelectronic device of claim 8, further comprising:
a second optoelectronic device overlaid said first optoelectronic device comprising:
a semiconductor unit;
a metal backing layer disposed under said semiconductor unit, wherein said metal backing layer acts as said external bus bar;
a buffer layer disposed under said metal backing layer; and a second plurality of blind vias filled with electrically conductive material and providing electrical access by said remaining pad areas to said metal backing layer through said buffer layer, wherein said second plurality of blind vias is aligned with said first plurality of blind vias, and wherein said metal layer is not connected to said compromised first pad area.

10. The optoelectronic device of claim 9, wherein said second optoelectronic device further comprises:
- a second p-n layer such that electrical energy is created when photons are absorbed by said second p-n layer, wherein said semiconductor unit comprises said second p-n layer;
- a second plurality of metal fingers disposed on a surface of said p-n layer for electrical conduction; and
- a second plurality of pad areas available for connection to a different external bus bar, wherein each of said second plurality of metal fingers is connected and adjacently disposed to a corresponding pad area of said second plurality of pad areas for forming an electrical contact between respective metal fingers and corresponding pad areas.

11. The optoelectronic device of claim 8, wherein said external bus bar overlays said first dielectric layer and is configured for connection to said electrically conductive material filling said first plurality of blind vias.

12. The optoelectronic device of claim 8, wherein the first p-n layer includes a base layer and an emitter layer that form a heterojunction.

13. The optoelectronic device of claim 12, wherein the base layer is a p-doped layer and the emitter layer is an n-doped layer.

14. The optoelectronic device of claim 12, wherein the base layer is an n-doped layer and the emitter layer is a p-doped layer.

* * * * *